United States Patent
Felsner et al.

(10) Patent No.: US 7,615,440 B2
(45) Date of Patent: Nov. 10, 2009

(54) CAPACITOR AND METHOD OF MANUFACTURING A CAPACITOR

(75) Inventors: Petra Felsner, Munich (DE); Thomas Schafbauer, Paris (FR); Uwe Kerst, Berlin (DE); Hans-Joachim Barth, Munich (DE); Erdem Kaltalioglu, Hsinchu (TW)

(73) Assignee: Infineon Technologies AG, Munich (DE)

( * ) Notice: Subject to any disclaimer, the term of this patent is extended or adjusted under 35 U.S.C. 154(b) by 108 days.

(21) Appl. No.: 11/851,969

(22) Filed: Sep. 7, 2007

(65) Prior Publication Data

US 2007/0294871 A1  Dec. 27, 2007

Related U.S. Application Data

(62) Division of application No. 10/370,535, filed on Feb. 20, 2003, now Pat. No. 7,268,383.

(51) Int. Cl.
*H01L 21/8242* (2006.01)

(52) U.S. Cl. ............... 438/240; 257/E21.582

(58) Field of Classification Search ........... 438/240, 438/244, 387; 257/E21.582
See application file for complete search history.

(56) References Cited

U.S. PATENT DOCUMENTS

| | | | |
|---|---|---|---|
| 4,891,684 A | 1/1990 | Nishioka et al. | |
| 5,675,187 A | 10/1997 | Numata et al. | |
| 5,780,334 A | 7/1998 | Lim et al. | |
| 5,949,098 A | 9/1999 | Mori | |
| 6,117,747 A | 9/2000 | Shao et al. | |
| 6,124,198 A | 9/2000 | Moslehi | |
| 6,255,186 B1 | 7/2001 | Al-Shareef et al. | |
| 6,346,741 B1 | 2/2002 | Van Buskirk et al. | |
| 6,348,373 B1 | 2/2002 | Ma et al. | |
| 6,410,955 B1 | 6/2002 | Baker et al. | |
| 6,451,667 B1 | 9/2002 | Ning | |
| 6,524,926 B1 | 2/2003 | Allman et al. | |
| 6,531,730 B2 | 3/2003 | Sandhu et al. | |
| 6,596,579 B1 * | 7/2003 | Randazzo et al. ........... 438/253 | |

(Continued)

FOREIGN PATENT DOCUMENTS

EP  1 109 227 A2  6/2001

(Continued)

OTHER PUBLICATIONS

Applied Materials Technical Training Manual, "DCVD Process: Optimization & Troubleshooting," Student Guide, Jun. 6, 2000, pp. 4-5, 4-11.

(Continued)

*Primary Examiner*—Chandra Chaudhari
(74) *Attorney, Agent, or Firm*—Slater & Matsil, L.L.P.

(57) ABSTRACT

In a method of fabricating a semiconductor device, a level of metal is formed within an interval dielectric. The level of metal includes a first metal line separated from a second metal line by a region of the interlevel dielectric. The region of interlevel dielectric is removed between the first metal line and the second metal line. A high-k dielectric is formed between the first metal line and the second metal line in the region where the interlevel dielectric was removed such that a capacitor is formed by the first metal line, the second metal line and the high-k dielectric.

21 Claims, 3 Drawing Sheets

U.S. PATENT DOCUMENTS

| | | |
|---|---|---|
| 6,646,299 B2 | 11/2003 | Willer et al. |
| 6,730,974 B2 | 5/2004 | Karasawa et al. |
| 6,735,726 B2 | 5/2004 | Muranaka et al. |
| 6,740,922 B2 | 5/2004 | Jones et al. |
| 6,747,307 B1 | 6/2004 | Vathulya et al. |
| 6,822,312 B2 | 11/2004 | Sowlati et al. |
| 2002/0017673 A1 | 2/2002 | Maeda et al. |
| 2002/0072189 A1 | 6/2002 | Haroun et al. |
| 2002/0081814 A1 | 6/2002 | Ning |
| 2002/0149043 A1 | 10/2002 | Willer et al. |

FOREIGN PATENT DOCUMENTS

| | | |
|---|---|---|
| EP | 1109227 A2 | 6/2001 |
| EP | 1139405 A2 | 10/2001 |
| JP | 08-273979 | 10/1996 |
| JP | 936252 | 2/1997 |
| JP | 2000-182890 | 6/2000 |
| JP | 2001-189235 | 7/2001 |
| JP | 2002-043306 | 2/2002 |
| WO | WO 01/29900 A1 | 4/2001 |
| WO | WO 02/052618 A2 | 7/2002 |

OTHER PUBLICATIONS

Singer, P., "Dual-Damascene Challenges Dielectric Etch," Semiconductor International, Aug. 1, 1999, pp. 1-4.

* cited by examiner

CAPACITOR AND METHOD OF MANUFACTURING A CAPACITOR

This is a divisional application of application Ser. No. 10/370,535, which was filed on Feb. 20, 2003 now U.S. Pat. No. 7,268,383 and which is incorporated herein by reference.

BACKGROUND

Semiconductor components are employed in many types of devices to perform a wide variety of applications. An important type of semiconductor component used in many devices is the capacitor. Though there are many types of capacitors, a typical capacitor structure comprises two plates, or electrodes, separated by a dielectric material. The capacitor stores a charge that can represent data. The capacitor can be used to provide isolation between electronic devices and can perform many other functions. In certain high demand technologies such as radio frequency ("RF"), mixed signal and dynamic random access memory ("DRAM"), the choice of capacitor can have a significant impact on system performance and cost.

A capacitor can be formed as an integral part of a semiconductor device, such as a trench capacitor disposed within a DRAM memory cell. A capacitor can be formed at various stages in the semiconductor chip fabrication process. For example, a capacitor can be formed during or after fabrication of interconnections between a semiconductor device and other areas of the chip. Processes performed before the fabrication of interconnections are commonly known as front end of line ("FEOL") processes. Processes performed during or after the fabrication of interconnections are referred to as back end of line ("BEOL") processes.

Semiconductor components, including capacitors, can be patterned using lithographic processes. For instance, after a dielectric material is deposited on a semiconductor substrate, a photolithographically formed masking layer having a desired pattern may be used to form one or more recesses in the dielectric material, wherein the masking layer exposes some areas of the dielectric material and leaves other areas of the dielectric material covered. Then, an etching process may remove exposed portions of the dielectric material. A layer of conductive or semiconductive material can be deposited in the recessed areas of the dielectric material. The steps of etching and depositing new material can be repeated until the desired component is formed.

A metal-insulator-metal capacitor ("MIMCAP") is a type of capacitor fabricated by a lithographic BEOL process. The MIMCAP includes metal layers that form the capacitor plates and an insulator that comprises the dielectric. MIMCAPs typically employ insulators such as silicon dioxide ($SiO_2$) or a nitride. Such materials may be used to form a capacitor with an area capacitance greater than 0.7 fF/$\mu m^2$ (femto Farads per square micron). A MIMCAP can be fabricated with a lithographic process that employs one or more masking layers. Each masking layer requires multiple steps, such as applying and patterning the masking layer, etching areas exposed by the patterned masking layer, removing any remaining masking layer and cleaning if necessary. Each masking layer must also be properly aligned to a prior masking layer. Thus, each additional step in the lithographic process increases the time and expense of fabricating the devices. In technologies employing copper-based interconnections, for example, most MIMCAPs require at least two masking layers to satisfy "qualification criteria," such as operating temperature, operating voltage and device lifetime.

Another type of capacitor that can be fabricated with a BEOL process is a vertical sandwich capacitor. FIG. 7 illustrates a cross-sectional view of a conventional vertical sandwich capacitor 300. The capacitor 300 is formed with metal layers and via layers in an interlevel dielectric ("ILD"), which may be fabricated in or on top of a base or substrate 301 of a semiconductor chip. As shown in FIG. 7, four metal layers and three via layers are employed, wherein the metal layers are substantially parallel to the plane of the substrate. Specifically, a first electrode 330 includes a first metal 304, a second metal 312, and a third metal 320 connected by a first via 308 and a second via 316. A second electrode 332 includes a first metal 306, a second metal 314, a third metal 322 and a fourth metal 326 separated by a first via 310, a second via 318 and a third via 324. An effective capacitance 340 is illustrated between the fourth metal 326 of the second electrode 332 and the third metal 320 of the first electrode 330. The vertical sandwich capacitor of FIG. 7 can be fabricated without additional masking steps. However, such capacitors typically require at least three metal layers as well as a relatively low area capacitance on the order of about 0.2 fF/$\mu m^2$. The vertical sandwich capacitor can be expensive because the relatively low area capacitance necessitates using a large area on the chip to form the capacitor, as well as at least three or more metal layers. Therefore, a need exists for a capacitor that can be fabricated as part of a BEOL process with a minimum of additional processes while providing a desired area capacitance.

SUMMARY OF THE INVENTION

The present invention provides a simple and low cost MIMCAP for use in various semiconductor devices that can be easily fabricated during BEOL processing.

In accordance with one aspect of the invention, a capacitor comprising a first electrode, a second electrode and a high-K dielectric is provided. The first electrode is formed in a semiconductor substrate. The first electrode includes a first via and a metal layer connected to the first via. The first electrode is in electrical contact with a first region of the semiconductor substrate. A second electrode is formed in the semiconductor substrate and includes a second via and a metal layer connected to the second via. The second electrode is in electrical contact with a second region of the semiconductor substrate. The high-K dielectric is disposed between the first electrode of the second electrode. Preferably, the metal layers of the first and second electrodes are disposed over the respective vias of the first and second electrodes. The high-K dielectric preferably has a dielectric constant of at least 3.9. The first and second electrodes may be interdigitated. The first electrode may additionally comprise a first outer lining which substantially surrounds the first via and the metal layer of the first electrode. Similarly, the second electrode may further comprise a second outer lining substantially surrounding the second via and the metal layer of the second electrode.

In accordance with other aspects of the invention, a semiconductor device is provided. The semiconductor device comprises a semiconductor substrate, a first electronic device, a second electronic device, a first electrode, a second electrode and a high-K dielectric. The first electronic device is formed in a first region of the semiconductor substrate. The second electronic device is formed in a second region of the semiconductor substrate. The first electrode is formed in a third region of the semiconductor substrate. The first electrode includes a first via and a metal layer connected thereto. The first electrode is in electrical contact with the first electronic device. The second electrode is formed in a fourth region of the semiconductor substrate. The second electrode includes a second via and a metal layer connected thereto. The second electrode is in electrical contact with the second electronic device. The high-K dielectric is disposed between the first electrode and the second electrode. The first electrode, the second electrode and the high-K electrode comprise a capacitor. The first electrode and the second electrode are preferably formed substantially perpendicular to a plane of the semiconductor substrate.

In accordance with other aspects of the invention, a method of fabricating a capacitor is provided. The method includes forming a first electrode on a first portion of a semiconductor substrate, forming a second electrode on a second portion of a semiconductor substrate and forming a high-K dielectric between the first and second electrodes. The first electrode includes a first via and a metal layer. The first electrode is in electrical contact with a first region of the semiconductor substrate. The second electrode includes a second via and a metal layer. The second electrode is in electrical contact with a second region of the semiconductor substrate. The step of forming the high-K dielectric preferably includes first removing an interlevel dielectric material from a third portion of the semiconductor substrate between the first electrode and the second electrode, and then depositing the high-K dielectric between the first electrode and the second electrode at a selected temperature. The selected temperature is preferably below 400.degree.C. More preferably, the first electrode and the second electrode are formed by a dual damascene process.

In accordance with additional aspects of the invention, a method of fabricating a semiconductor device is provided. The method comprises forming a first electronic device in a first region of a semiconductor substrate, forming a second electronic device in a second region of the semiconductor substrate, forming a first electrode in a third region of a semiconductor device, forming a second electrode in a fourth region of a semiconductor device and forming a high-K dielectric between the first and second electrodes. The first electrode includes a first via and a metal layer. The first electrode is in electrical contact with the first electronic device. The second electrode includes a second via and a metal layer. The second electrode is in electrical contact with the second electronic device. Preferably, the first and second electrodes are formed to have an interdigitated structure. More preferably, a dual damascene process is used to form the first electrode and the second electrode.

The foregoing aspects, features and advantages of the present invention will be further appreciated when considered with reference to the following description of the preferred embodiments and accompanying drawings.

DETAILED DESCRIPTION OF ILLUSTRATIVE EMBODIMENTS

The present invention will now be described in relation to the drawings, wherein like reference numbers represent like elements. It is to be appreciated that certain steps may be performed in different order or at the same time.

Figure 1:
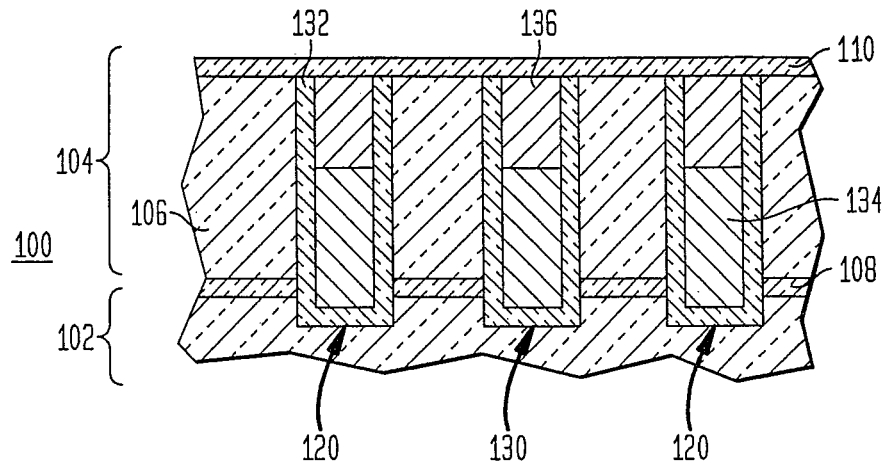
FIG. 1 is a cross-sectional view of a semiconductor device of the present invention prior to formation of the capacitor sidewalls.

FIG. 1 illustrates a cross-sectional view of a stage in a process of fabricating a capacitor of the invention on a semiconductor substrate 100. As used herein, the term "semiconductor substrate" is not limited to the initial blanket wafer. It may include materials, components and/or devices formed therein. As used herein, the term "on" means on or within the substrate, whether or not in direct contact with the substrate. The substrate 100 includes a lower portion 102, in which may be formed one or more semiconductor devices (not shown) such as trench capacitors or transistors. The lower portion 102 is preferably silicon, but other materials such as gallium arsenide, indium phosphide or silicon carbide may be used. The lower portion 102 may also include one or more grown or deposited layers of material formed on the substrate 100. Portions of the layers of material have been typically patterned, etched and/or doped to form semiconductor devices.

A liner 108 is preferably formed atop the lower portion 102 and separates the lower portion 102 from an upper portion 104. The liner 108 may be substantially non-conductive, and is preferably formed of a nitride or other insulator material.

The upper portion 104 is formed atop the liner 108 and includes an ILD 106 covering at least a portion of a top surface of the liner 108. The ILD 106 electrically isolates interconnections that are arranged in multiple levels of the upper portion 104. Preferably, the dielectric constant of the ILD 106 should be as low as possible to minimize coupling, or "cross-talk," between neighboring interconnections. Cross-talk between interconnections may interfere with device operation or may damage devices associated with them. More preferably, the material of the ILD 106 has a dielectric constant below that of silicon dioxide, 3.9. By way of example only, the ILD 106 may be Silk™, a semiconductor dielectric resin from the Dow Chemical Company, which has a dielectric constant of less than 3.

Interconnections 120, 130 are formed in the upper portion 104 and may contact different electronic devices in the lower portion 102 through openings in the liner 108 and/or provide connections to other areas of the substrate 100, such as to an inductor device in or above upper portion 104. Electronic devices include, by way of example only, transistors, inductors, or other active or passive devices.

In the cross-sectional view of FIG. 1, the interconnection 120 is shown on either side of the interconnection 130, with the ILD 106 providing electrical isolation between the interconnections 120, 130. The interconnections 120, 130 can be segmented or interdigitated, and, as shown in the top view of FIG. 4, may form a comb-like or interleaved structure substantially perpendicular to the plane of the substrate 100.

Returning to FIG. 1, each interconnection 120, 130 preferably comprises an outer lining 132, a via portion 134 and a contact portion 136. The via portion 134 provides an electrical connection and extends from the upper portion 104 into the lower portion 102. The contact portion 136 preferably provides a lateral connection within the upper portion 104 of the substrate 100. The via portion 134 and the contact 136 can be formed at the same time or in successive process steps. Preferably, the via portion 134 and the contact portion 136 are metal. More preferably, they comprise copper. A variety of processes including a damascene process can be used to fabricate the interconnections 120, 130. The overall structure is a "horizontal sandwich" capacitor.

A damascene process forms metal interconnections by means of chemical mechanical polishing ("CMP"). An interconnect pattern may be lithographically defined in a layer of dielectric material. Next, metal may be deposited to fill the interconnect pattern. Then CMP may remove any excess metal by means of a slurry compound applied to the metal.

More preferably a dual damascene process is employed to form the interconnections 120, 130. A dual damascene process is a modified version of a typical damascene process. In a dual damascene process, two interconnect patterns may be lithographically defined in a layer of dielectric material. Next, metal may be deposited to fill the interconnect patterns. Then CMP may be used to remove any excess metal by means of a slurry compound applied to the metal.

A process for fabricating the interconnections 120, 130 will now be described. First, the ILD 106 of the upper portion 104 is deposited atop the liner 108. The ILD 106 is then planarized by, for example, CMP, to produce a level surface. Next, a first masking layer is deposited over the ILD 106 and is patterned using a suitable lithographic technique. The patterned first masking layer exposes portions of the ILD 106 for forming the via portion 134. The exposed parts of the ILD 106 are etched to form recesses, using, e.g., Reactive Ion Etching ("RIE") or another etching process. Next, a second masking layer is deposited and patterned over the ILD 106. The second masking layer is pattern for forming the contact portion 136. Then, the ILD 106 is etched to form recesses where the contact portion 136 will be deposited. Optionally, the same masking and etching steps are used for both the via portion 134 and the contact portion 136.

The etched recesses preferably extend through the upper portion 104 and the liner 108 into a region of the lower portion 102. The region can be, for example, a component of a semiconductor device such as the source or drain of a transistor, or an electrode of a capacitor.

Next, the outer lining 132 is preferably deposited along sidewalls of the recesses. (The outer lining 132 may be a conductive material, such as a metal.) After the outer lining 132 is deposited, the recesses are filled with a metal such as copper, which preferably forms both the via portion 134 and the contact portion 136. The metal may then be planarized by CMP. Afterward, a top liner 110 is deposited over the ILD 106 and over the interconnections 120, 130. The top liner 110 is preferably a non-conductive material, e.g. a nitride.

Figure 2:
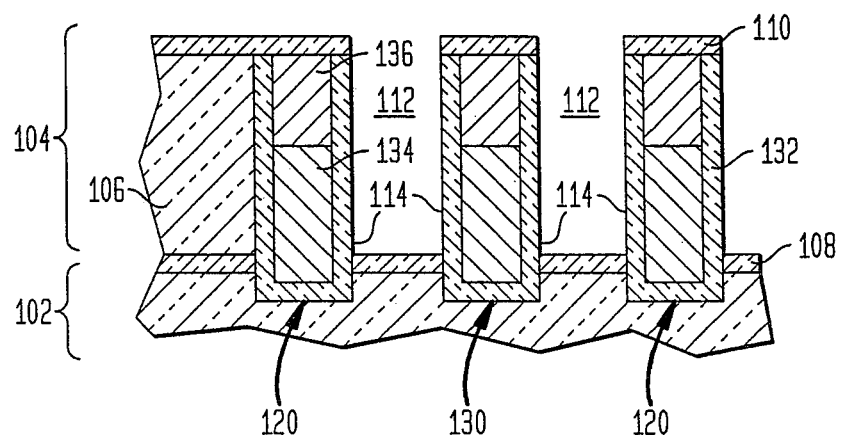
FIG. 2 is a cross-sectional view of the semiconductor device of the present invention after a top liner layer is etched and part of the interlevel dielectric is removed to define the capacitor sidewalls.

A further masking layer is deposited over the top liner 110 and is patterned to expose part of the ILD 106 and the top liner 110 between selected portions of interconnections 120, 130. As shown in FIG. 2, the top liner 110 and the ILD 106 exposed by the further masking layer can be etched by RIE or another etching process, forming trenches 112 between the interconnections 120, 130. The trenches 112 are defined by exterior sidewalls 114 of the outer lining 132 and a floor defined by the liner 108.

Figure 3:
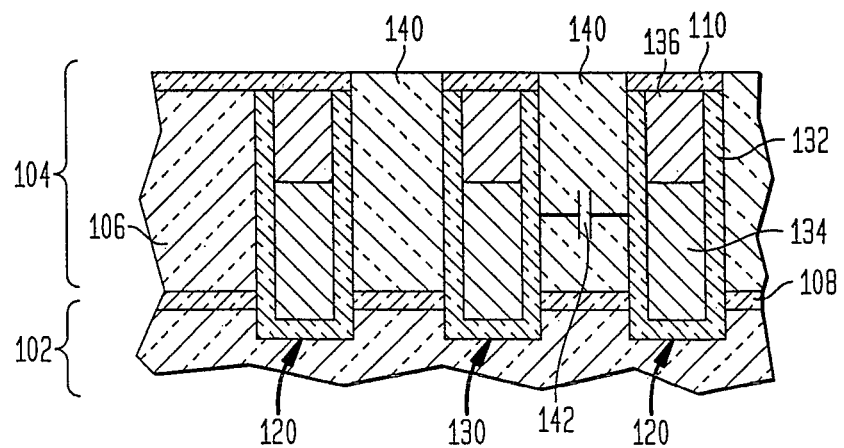
FIG. 3 is a cross-sectional view of the semiconductor device of the present invention after a high-k dielectric is deposited.

After the ILD 106 between selected portions of interconnections 120, 130 has been etched, a high dielectric constant ("high-K") dielectric 140 is formed within the trenches 112, for instance, by chemical vapor deposition ("CVD"), as FIG. 3 illustrates. The high-K dielectric 140, together with the interconnections 120, 130 on either side, forms a capacitor 142. The interconnections 120, 130 act as the electrodes for the capacitor 142. Preferably the high-K dielectric 140 has a dielectric constant at least as great as that of $SiO_2$, which is approximately 3.9. More preferably, the high-K dielectric 140 is a material having a dielectric constant greater than $SiO_2$, such as nitride, having a dielectric constant of about 7, or tantalum pentoxide ($Ta_2O.5$), having a dielectric constant of about 25. The resulting capacitor 142 preferably has an area capacitance of approximately 0.7 fF/$\mu m^2$. Note that the capacitance depends on factors including the dielectric constant, the spacing between the interconnections 120, 130 and the height of each interconnection 120, 130.

In addition to having a high dielectric constant, the selection of the material for the high-K dielectric 140 is determined by the material's reliability properties, including breakdown behavior and qualification criteria. It is also desirable to choose a dielectric material that substantially fills the trenches 112 while minimizing the formation of seams, voids or other defects therein. Yet another factor in selecting a material is the leakage current of the high-K dielectric 140. Generally speaking, leakage current is an unwanted parasitic current flowing through the semiconductor device. Thus, the high K dielectric should be selected to meet the aforementioned criteria.

The high-K dielectric is preferably deposited at a temperature at which the metal that comprises the interconnections 120, 130 is not melted or otherwise damaged. Preferably, the deposition temperature of the high-K dielectric 140 is below about 400.degree.C. Optionally, the high-K dielectric 140 can be deposited in layers or, alternatively, additional high-K dielectric 140 may be added at later manufacturing steps.

As FIGS. 1-3 illustrate, the capacitor 142 can be fabricated with only one additional masking layer after the interconnections 120, 130 are fabricated. Further processing can be performed, such as planarizing the surface of the high-k dielectric 140, providing leads to the capacitor 142, and forming additional layers of interconnections 120, 130.

Figure 4:
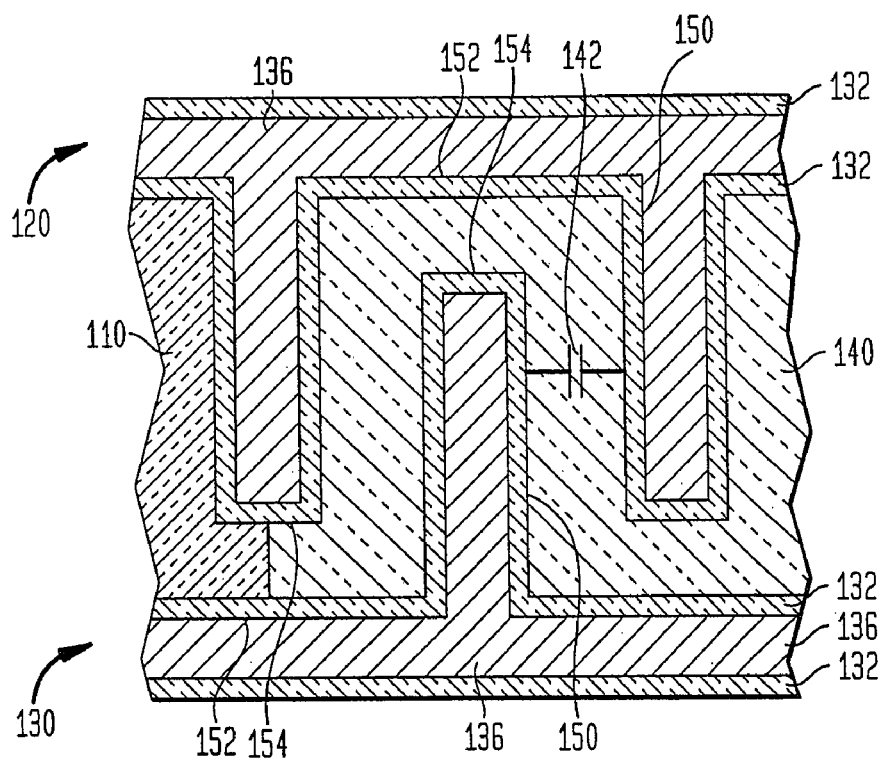
FIG. 4 is a top view of the semiconductor device of the present invention.

FIG. 4 is a top view showing the substrate 100 including the capacitor 142. The top liner 110 covers the ILD 106. The top liner 110 is only partly shown to more clearly illustrate the capacitor 142. Optionally, the top liner 110 may also cover some or all of the interconnections 120, 130. The interconnections 120, 130 may be segmented or interdigitated to form a comb-like structure, as seen in the cross-sections of FIGS. 1-3. However, other geometries may be employed in which the segments of interconnections 120, 130 that are used to fabricate the capacitor 142 are substantially parallel to one another. The segments may include one or more of a sidewall 150, a further sidewall 152 and an endwall 154. The further sidewall may be adjacent to the sidewall 150. The endwall may be adjacent to the sidewall 150.

Figure 5:
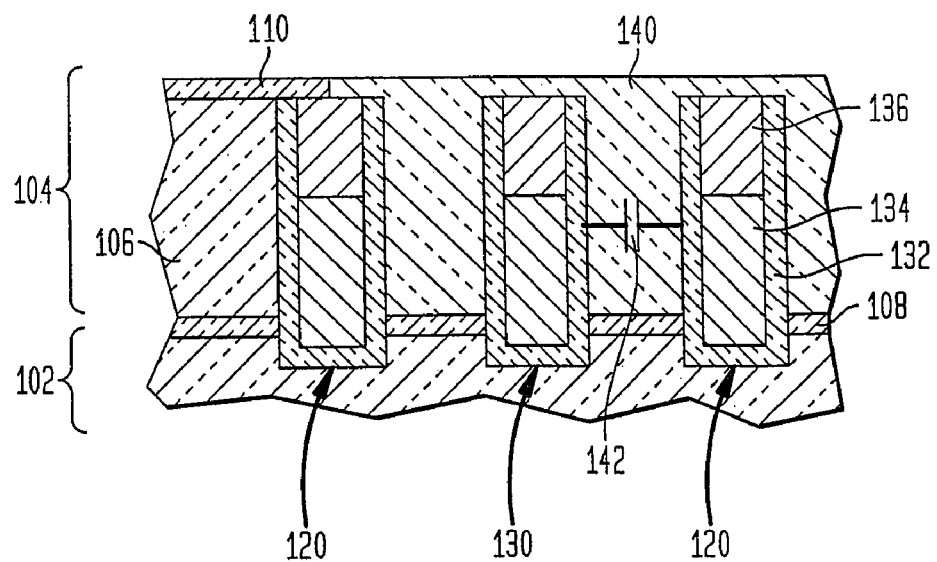
FIG. 5 is a cross-sectional view illustrating the result of an alternative step in a process of forming a semiconductor device of the present invention.

FIG. 5 illustrates another embodiment of the present invention in which the top liner 110 covers the ILD 106 but does not cover the interconnections 120, 130 where the high-K dielectric 140 has been deposited. A simple lithography masking step can be used for etching the ILD 106 in preparation of depositing the high-K dielectric 140. The top liner 110 may be removed before depositing high-K dielectric 140, and a new top liner layer deposited on top of the interconnections 120, 130 so that additional interconnection layers may be formed on the substrate 100 in subsequent manufacturing steps.

Figure 6:
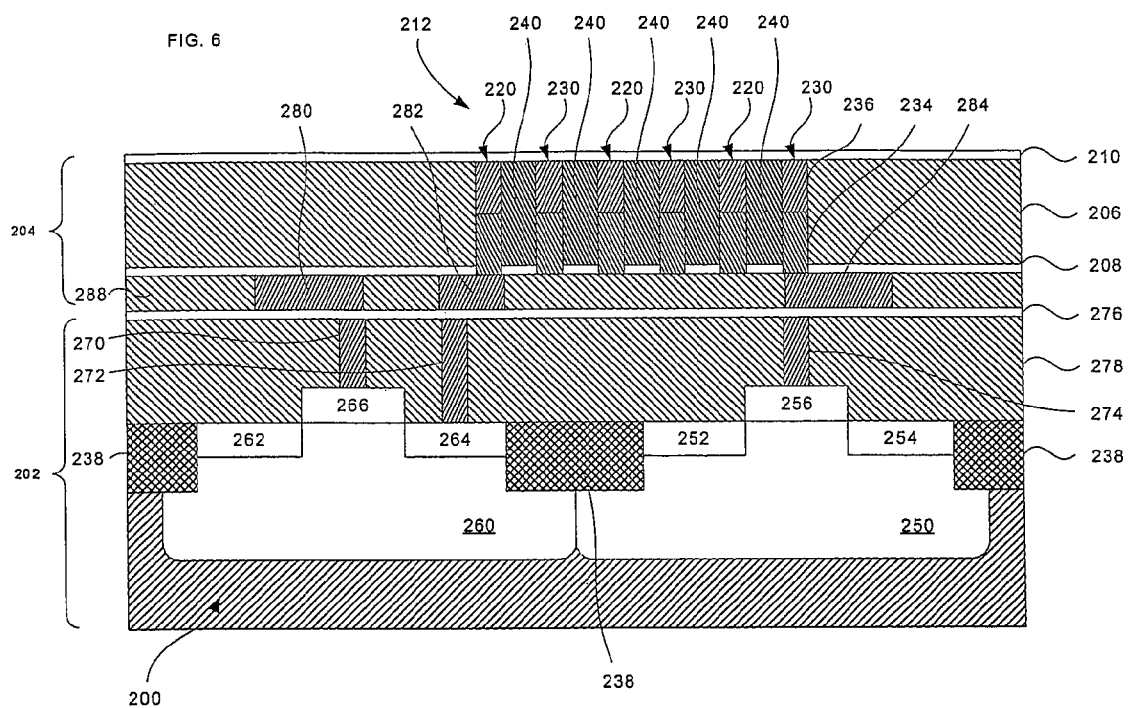
FIG. 6 is a cross-sectional view of a semiconductor device of the present invention disposed on top of active devices.
Figure 7:
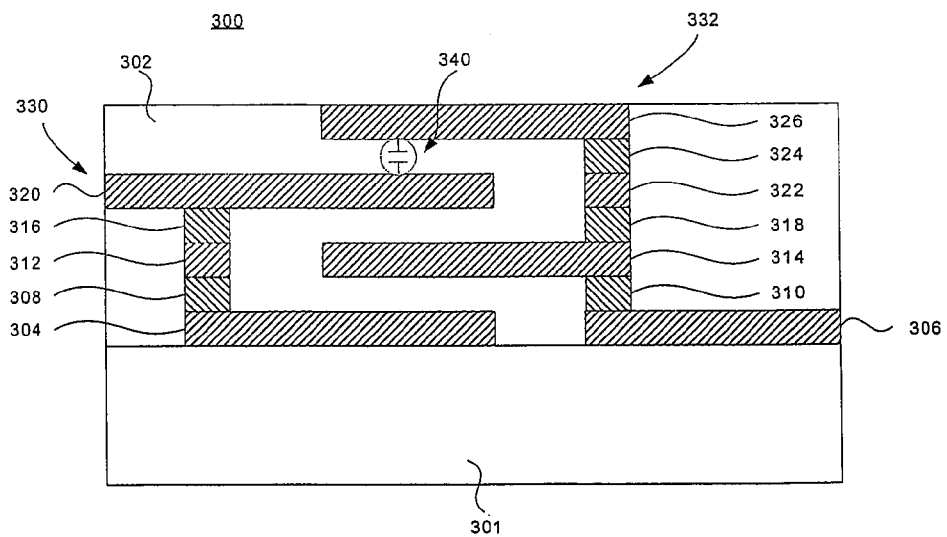
FIG. 7 illustrates a conventional vertical sandwich capacitor.

FIG. 6 illustrates a BEOL portion 204 disposed over an FEOL portion 202 formed on a substrate 200. As in the embodiments described with respect to FIGS. 1-5, a liner 208 preferably separates the FEOL portion 202 and the BEOL portion 204. The BEOL portion 204 preferably includes an ILD 206, a top liner 210 and a capacitor 212 formed in accordance with aspects of the present invention. The capacitor 212 comprises interconnections 220 and 230 separated by a high-K dielectric 240. The interconnections include contact portions 236 and via portions 234, which preferably are formed of the same metal, e.g., copper, during a dual damascene process. An outer lining (not shown) may substantially sheath the contact portion 236 and the via portion 234. Returning to the capacitor 212, the via portion 234 may be formed on a first via layer above the first metal layer. Similarly, the contact portion 236 may be formed on a second metal layer.

The FEOL portion 202 preferably includes active devices, which may be formed, e.g., on an n-well 250 and a p-well 260 as is known in the art. As shown in the figure, the active devices are field effective transistors formed of respective sources 252, 262, drains 254, 264 and gates 256, 266. However, other devices may be employed. Isolation 238, e.g., shallow trench isolation, preferably separates the active devices.

As shown in the figure, the capacitor 212 is connected to the active devices in the wells 250, 260 through contacts. Specifically, interconnection 220 is connected to source 264 through a contact 282 and a contact 272, which may be on different levels separated by a layer 276. Note that the contact 282 and the contact 272 are preferably in direct physical contact, e.g., one of the contacts 272, 282 extends through the layer 276. Similarly, the interconnection 230 is connected to the gate 256 through a contact 284 and a contact 274. As with contacts 272 and 282, the contacts 274 and 284 are preferably in direct physical contact.

The gate 266 may connect to, e.g., a signal or power source through contacts 270 and 280. The contacts 280, 282 and 284 are preferably of metal, and may be formed in a first metal layer above the active devices. The contacts 280, 282 and 284 may be isolated by an ILD 288. Similarly, the contacts 270, 272 and 274 may be vias separated by an ILD 278.

One advantage of the present invention is that a horizontal sandwich capacitor can be fabricated more effectively than previous capacitors such as MIMCAPS and vertical sandwich capacitors. The area capacitance of the horizontal sandwich capacitor is on the order of 0.7 fF/$\mu$m$^2$ versus an area capacitance of 0.2 fF/$\mu$m$^2$ for a vertical sandwich capacitor. The horizontal sandwich capacitor may be formed using one mask in addition to conventional processing, while a MIMCAP may require two, three or more masks in addition to a conventional process. Another advantage is that capacitors of the present invention may be fabricated using a dual damascene process, further reducing cost and complexity. Yet another advantage is the use of a high-K dielectric in the capacitor to enhance the area capacitance.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A method of fabricating a capacitor, the method comprising:
    forming a first electrode over a first portion of a semiconductor body, the first electrode including a first via and a first line that is in electrical contact with the first via;
    forming a second electrode over a second portion of the semiconductor body, the second electrode including a second via and a second line that is in electrical contact with the second via;
    forming a high-k dielectric between the first line and the second line and between the first via and the second via such that the first electrode forms a first vertical plate of a capacitor and the second electrode forms a second vertical plate of a capacitor; and
    forming a first dielectric adjacent an opposing side of the first line from the high-k dielectric, the first dielectric having a lower dielectric constant than the high-k dielectric.

2. The method of claim 1, wherein forming the high-k dielectric comprises:
    removing a region of the first dielectric from between the first line and the second line and between the first via and the second via; and
    depositing the high-k dielectric between the first electrode and the second electrode at a selected temperature.

3. The method of claim 2, wherein the selected temperature is below 400° C.

4. The method of claim 1, wherein the first electrode and the second electrode are formed by a dual damascene process.

5. The method of claim 1, wherein, prior to forming the first and second electrodes, the method further comprises:
    depositing the first dielectric;
    forming a plurality of recesses in the first dielectric;
    depositing a first outer lining in a first recess of the plurality of recesses; and
    depositing a second outer lining in a second recess of the plurality of recesses;
    wherein the first electrode is formed substantially within the first outer lining and the second electrode is formed substantially within the second outer lining.

6. A method of fabricating a semiconductor device, the method comprising:
    forming a level of metal within an interlevel dielectric, the level of metal comprising a first metal line separated from a second metal line by a region of the interlevel dielectric;
    removing the region of interlevel dielectric between the first metal line and the second metal line; and
    forming a high-k dielectric between the first metal line and the second metal line in the region where the interlevel dielectric was removed such that a capacitor is formed by the first metal line, the second metal line and the high-k dielectric, the high-k dielectric having a dielectric constant that is greater than a dielectric constant of the interlevel dielectric.

7. The method of claim 6, further comprising forming first and second vias prior to forming the level of metal, the first via being electrically coupled to the first metal line and the second via being coupled to the second metal line, wherein forming the high-k dielectric further comprises forming the high-k dielectric between the first via and the second via.

8. The method of claim 7, wherein the first via and the second via are electrically coupled to a device formed in a semiconductor material.

9. The method of claim 7, wherein the first via and the second via are electrically and physically coupled to a device formed in a semiconductor material.

10. The method of claim 6, further comprising forming first and second vias while forming the level of metal, the first via being electrically coupled to the first metal line and the second via being coupled to the second metal line, wherein forming the high-k dielectric further comprises forming the high-k dielectric between the first via and the second via.

11. The method of claim 6, wherein the first metal line comprises at least a first finger and a second finger and wherein the second metal line comprises at least one finger that laterally extends between the first finger and the second finger of the first line so as to form an interdigitated capacitor.

12. The method of claim 6, wherein the first metal line and the second metal line are formed substantially perpendicular to a plane of a semiconductor substrate.

13. The method of claim 6, wherein removing the region of interlevel dielectric between the first metal line and the second metal line comprises leaving portions of the interlevel dielectric outside the region between the first metal line and the second metal line.

14. The method of claim 6, further comprising forming a transistor device in a semiconductor body, the level of metal overlying the semiconductor body.

15. The method of claim 14, further comprising forming an additional level of metal overlying the semiconductor body, the level of metal overlying the additional level of metal.

16. The method of claim 6, wherein the high-k dielectric has a dielectric constant greater than 3.9.

17. The method of claim 16, wherein the interlevel dielectric has a dielectric constant less than 3.9.

18. The method of claim 6, wherein forming the level of metal within the interval dielectric comprises:
   forming the interval dielectric;
   forming a plurality of trenches within the interlevel dielectric; and
   filling the trenches with metal.

19. The method of claim 18, wherein the metal comprises copper.

20. The method of claim 6, wherein the high-k dielectric is a nitride.

21. The method of claim 6, wherein the high-k dielectric is tantalum pentoxide.

* * * * *